(12) United States Patent
Bouvier et al.

(10) Patent No.: US 11,978,763 B2
(45) Date of Patent: May 7, 2024

(54) ELECTRICAL DEVICE COMPRISING A 3D CAPACITOR AND A REGION SURROUNDED BY A THROUGH OPENING

(71) Applicant: Murata Manufacturing Co., Ltd., Nagaokakyo (JP)

(72) Inventors: Stéphane Bouvier, Cairon (FR); Nicolas Normand, Herouville Saint Clair (FR); Emmanuel Lefeuvre, Caen (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 205 days.

(21) Appl. No.: 17/551,437

(22) Filed: Dec. 15, 2021

(65) Prior Publication Data

US 2022/0190101 A1 Jun. 16, 2022

(30) Foreign Application Priority Data

Dec. 15, 2020 (EP) .................................. 20306573

(51) Int. Cl.
*H01L 21/768* (2006.01)
*H01L 23/522* (2006.01)
(Continued)

(52) U.S. Cl.
CPC ........ *H01L 28/60* (2013.01); *H01L 21/76816* (2013.01); *H01L 23/5223* (2013.01); *H01L 27/0805* (2013.01)

(58) Field of Classification Search
CPC ... H01L 28/60; H01L 28/90; H01L 21/76816; H01L 23/5223; H01L 27/0805;
(Continued)

(56) References Cited

U.S. PATENT DOCUMENTS 6,630,380 B1 10/2003 Cheng et al.
9,349,787 B1 * 5/2016 Lee .................. H01L 21/76877
(Continued)

FOREIGN PATENT DOCUMENTS

CN 103094068 B 11/2015
EP 3680931 A1 8/2019
(Continued)

OTHER PUBLICATIONS

European Search Report issued for EP Application No. 20 30 6573, dated Jul. 1, 2021.

*Primary Examiner* — Shahed Ahmed
*Assistant Examiner* — Vicki B. Booker
(74) *Attorney, Agent, or Firm* — Arentfox Shiff LLP

(57) ABSTRACT

An electrical device that includes a substrate; a 3D capacitor including a capacitor dielectric region of a dielectric material, a capacitor electrode region of a conductive material, the capacitor dielectric region and the capacitor electrode region being arranged at least partially inside a cavity extending in the substrate from a top face of the substrate; and a surrounding through opening in the substrate and which surrounds a surrounded substrate region, the 3D capacitor being outside of the surrounded substrate region, the surrounding through opening extending from the top face to a bottom face of the substrate, wherein inside the surrounding through opening a surrounding dielectric region of the dielectric material and a surrounding conductive region of the conductive material are arranged.

11 Claims, 8 Drawing Sheets

(51) Int. Cl.
*H01L 27/08* (2006.01)
*H01L 49/02* (2006.01)

(58) Field of Classification Search
CPC ........ H01G 4/005; H01G 4/012; H01G 4/385; H01G 4/33
See application file for complete search history.

(56) References Cited

U.S. PATENT DOCUMENTS

| | | | |
|---|---|---|---|
| 2002/0096701 A1* | 7/2002 | Torii | H10B 12/0335 257/E21.589 |
| 2006/0141793 A1* | 6/2006 | Anceau | H01L 29/66181 257/E21.396 |
| 2007/0155089 A1 | 7/2007 | Yeh et al. | |
| 2017/0148869 A1* | 5/2017 | Detalle | H01L 28/40 |

FOREIGN PATENT DOCUMENTS

| | | |
|---|---|---|
| EP | 3632504 A1 | 4/2020 |
| WO | 2007125510 A2 | 11/2007 |

\* cited by examiner

ELECTRICAL DEVICE COMPRISING A 3D CAPACITOR AND A REGION SURROUNDED BY A THROUGH OPENING

CROSS REFERENCE TO RELATED APPLICATIONS

The present application claims priority to European Patent Application No. 20306573.5, filed Dec. 15, 2020, the entire contents of each of which are incorporated herein by reference.

FIELD OF THE INVENTION

The present invention relates to the field of integration and, more particularly, to implantable semiconductor devices in a medical context.

TECHNICAL BACKGROUND

The integration of various components on semiconductor substrate has paved the way for integrated devices which are implantable. Typically implantable devices require that Electronic components such as capacitors may be integrated into semiconductor products in a variety of forms. For example, planar capacitors may be formed above semiconductor substrates by forming two planar electrodes separated by a dielectric layer. However planar capacitors provide low capacitance density, this implies that a high value capacitance will consume a significant area of silicon.

To overcome this issue, it has been proposed to form three-dimensional structures to increase the capacitance of capacitors. Capacitance densities of the order of a Farad per $m^2$ have been achieved using three-dimensional (3D) capacitors.

A 3D capacitor comprises functional electrodes presenting a relief (for example they comprise a surface presenting a relief or they are formed on a relief such as a pore, a hole, a trench, or a pillar). Typically, it is possible to form a conductive 3D structure by using Deep Reactive Ion Etching, followed by subsequent deposition steps of a dielectric and of a conductive material to form a capacitor. Document WO 2007125510 discloses a method for forming such a 3D capacitor.

Implementable semiconductor devices may be inserted in a human or animal body so as to be in contact with biological tissue (a portion of a human or animal body). Typically, these devices comprise an electrode to provide an electrical contact between the device and the biological tissue. The dimensions and geometry of the electrodes may be chosen so as to optimize the quality of the sensed signals, if signals are sensed.

The electrode may then be used for sensing electrical signals in the biological tissue or also for stimulating the biological tissue. Typically, the electrodes receive signals that are processed by an electronic circuit, or emit signals that have been generated by an electronic circuit. These electronic circuits may comprise, by way of example, a processor.

It is conceivable to the person skilled in the art that these implantable electronic devices have to be biocompatible and that this requirement extends to the electronic circuits and to the electrodes. This implies restrictions on the materials that may be used but also on the electrical functions of the device. Means for preventing continuous voltages from appearing in the body in which the implementable semiconductor device is implemented are usually required, typically, capacitors are used.

From the prior art, document EP3632504 is known. This document discloses an implementable device including a capacitor (in some embodiments a 3D capacitor) wherein a substrate is used as both a capacitor electrode and as the electrode which will be in contact with biological tissue.

There is still a need for the integration of more complex devices.

It should be noted that the implantable medical devices of the prior art are usually in the form of a system in package (SIP), a System on a Chip (SOC), or a system buried in an epoxy material (embedded system). Also, an emerging trend relates to the use of System on Silicon (SOS) devices. An SOS device comprises active, MEMS, and passive dies stacked together with copper vias forming electrical contacts through the stack. These systems are usually autonomous (for example they can communication with Bluetooth technology, they can integrate micro battery elements or supercapacitors, and they can be powered wirelessly). The use of copper vias is usually required to form stacked devices. However, using copper presents drawbacks in terms of equipment contamination, cost, and complexity (notably when implemented in silicon technologies).

The present invention has been made in the light of the above problems.

SUMMARY OF THE INVENTION

The present invention provides an electrical device comprising: a semiconductor substrate having a top face and a bottom face; a 3D capacitor including a capacitor dielectric region of a dielectric material, a capacitor electrode region of a conductive material, the capacitor dielectric region and the capacitor electrode region being arranged at least partially inside a cavity extending in the substrate from the top face; and a surrounding through opening formed in the substrate and which surrounds a surrounded substrate region, the 3D capacitor being outside of the surrounded substrate region, the surrounding through opening extending from the top face to the bottom face of the substrate, wherein inside the surrounding through opening a surrounding dielectric region of the dielectric material and a surrounding conductive region of the conductive material are arranged, the surrounding dielectric region extending in the surrounding through opening from the top face to the bottom face of the substrate and all around the surrounded substrate region.

Thus, the invention proposes to form a surrounded region of the substrate which will be electrically insulated from other portions of the substrate by the surrounding through opening in which the dielectric forms an insulating wall. Consequently, the surrounded region may be used:
- as a through silicon via to form contacts with a module or modules connected to the top or to the bottom of this surrounded region, or even
- as a separate region in which a different operating voltage domain may be used.

Using the same material for the capacitor dielectric region and for the surrounding dielectric region allows using a process already used for forming the dielectric region of the capacitor for forming the surrounding dielectric region. Similarly, using the same material for the capacitor electrode region and for the surrounding conductive region allows using a process already used for forming the electrode region of the capacitor for forming the surrounding conductive region.

It should be noted that the surrounding through opening can have any shape. Preferably, it is defined by two parallel side walls, for example formed along two concentric circles.

The cavity can be a blind hole, or a trench, or a network of trenches formed around pillars.

Thus, manufacturing the above device is simple.

According to a particular embodiment, the semiconductor substrate is electrically conducting at least in a portion of the substrate extending from the side walls (i.e. all the side walls if there are multiple side walls) and the bottom of the cavity, and in a portion of the substrate extending from the side walls of the surrounding through opening (i.e. the two facing side walls of the surrounding through opening, the one on the side of the surrounded region and the one opposite that one).

By way of example, the substrate can be doped after the cavity and the surrounding through opening have been formed so as to increase the conductivity locally.

The portions of the substrate which are doped may then act as bottom electrodes for the capacitor, in a manner which is known in itself, for example described in document WO 2007125510. Having said that, doping the side walls of the surrounding through opening is not known from this document, but allows forming at least two capacitors in series on each side of the surrounding through opening.

Preferably, the substrate is entirely conductive (for example it has a doping level which makes it conductive). Thus, no additional doping step may be required, and the surrounded region has a good conductivity to form a conductive via from its top to its bottom.

By conductive, what is meant is that the above mentioned portions (or the entire substrate) have a resistivity comprised between 1 mOhm·cm and 1 Ohm·cm or preferably comprised between 1 mOhm·cm and 10 mOhm·cm.

According to a particular embodiment, the capacitor dielectric region is arranged on the bottom and on the side walls (i.e. all the side walls) of the cavity, and the capacitor electrode region is arranged on (for example above, and, also for example, it covers in a conformal manner) the capacitor dielectric region on the side of the inside of the cavity with respect to the capacitor dielectric region, and wherein the surrounding dielectric region is arranged on the side walls (i.e. both side walls) of the surrounding through opening, the surrounding conductive region is arranged on (for example above, and, also for example, it covers in a conformal manner) the surrounding dielectric region on the side of the inside of the surrounding through opening with respect to the surrounding dielectric region.

According to a particular embodiment, the surrounding dielectric region or the surrounding conductive region extends at the bottom of the surrounding through opening in the same plane as the bottom face of the substrate.

In other words the surrounding dielectric region presents at face at the bottom of the surrounding through opening.

According to a particular embodiment, the 3D capacitor comprises a supplementary capacitor dielectric region arranged on the capacitor electrode region on the side of the inside of the cavity with respect to the capacitor electrode region, and a supplementary capacitor electrode region on the side of the inside of the cavity with respect to the supplementary capacitor dielectric region, and wherein inside the surrounding through opening a supplementary surrounding dielectric region is arranged on the surrounding conductive region on the side of the inside of the surrounding through opening with respect to the surrounding conductive region, and a supplementary surrounding conductive region is arranged on the supplementary surrounding dielectric region on the side of the inside of the surrounding through opening with respect to the supplementary surrounding dielectric region.

In other words, a MIMIM process is used both in the capacitor and in the surrounding through opening.

In the capacitor, this allows forming parallel capacitors (with the appropriate connections between the electrodes), and in the surrounding through opening, this may increase the electrical insulation between the surrounded region and the other portions of the substrate.

According to a particular embodiment, the supplementary surrounding conductive region or the supplementary surrounding dielectric region extends at the bottom of the surrounding through opening in the same plane as the bottom face of the substrate.

In this particular embodiment, it is ensured that both surrounding dielectric regions will participate to insulating the surrounded region.

According to a particular embodiment, the surface area of the top of the surrounded region and of the bottom of the surrounded region is greater than 2000 $\mu m^2$.

For example and as a result of this surface area and of the conductivity/resistivity of the surrounded region, the surrounded region has a resistance (measured from the top to the bottom of less than 10 Ohms, or preferably less than 1 Ohm is desirable.

According to a particular embodiment, the device further comprises a supplementary surrounding through opening surrounding the surrounding through opening, with the 3D capacitor being outside of the supplementary surrounding through opening, wherein inside the surrounding through opening a surrounding dielectric region of the dielectric material and a surrounding conductive region of the conductive material are arranged, the surrounding dielectric region extending in the supplementary surrounding through opening from the top face of to the bottom face of the substrate and all around the surrounded substrate region.

Forming a plurality of surrounding through openings (i.e. 2 or more) which form successive barriers allows adapting the electrical insulation between the surrounded region and the rest of the substrate, without modifying the process. In other words, the breakdown voltage between the surrounded region and the rest of the substrate can be adapted by using a specific number of surrounding through openings.

Each supplementary surrounding through opening may have the same structure as the surrounding through opening (i.e. it may comprise the same elements arranged in a similar manner).

According to a particular embodiment, the device further comprises a metal pad connected to the top of the surrounded region and/or a metal pad connected to the bottom of the surrounded region.

According to a particular embodiment, the device further comprises a metal pad connected to the bottom face of the substrate bellow the 3D capacitor.

This metal pad allows having an access to the bottom electrode of the capacitor.

According to a particular embodiment, the device further comprises a module connected to the pad connected to the top of the surrounded region or connected to the pad connected to the bottom of the surrounded region.

This module can be a semiconductor chip, or an electrical device having a structure which is identical to the one having the substrate, the capacitor, and the surrounded region.

The invention also proposes a method of manufacturing an electrical device as defined above comprising: forming the cavity from the top face of the substrate; forming a surrounding blind opening from the top face of the substrate; forming the capacitor dielectric region, the capacitor electrode region, the surrounding dielectric region, and the surrounding conductive region; grinding the substrate from the face opposite the top face so as to: obtain the bottom face of the substrate, reach the surrounding dielectric region, and open the surrounding blind opening to obtain the surrounding through opening.

Thus, the mechanical integrity of the device is obtained by first forming the dielectric and conductive regions, before grinding the bottom of the substrate. This will open the surrounding blind opening while ensuring that the formed regions maintain the surrounded region.

According to a particular embodiment, forming the capacitor dielectric region, the capacitor electrode region, the surrounding dielectric region, and the surrounding conductive region comprises: a deposition of a layer of the dielectric material; a patterning of the layer of the dielectric material so as to respectively delimit the capacitor dielectric region from the surrounding dielectric region; a deposition of a layer of the conductive material; a patterning of the layer of the layer of the conductive material so as to respectively delimit the capacitor electrode region from the surrounding conductive region.

According to a particular embodiment, forming the cavity and forming the surrounding blind opening is performed in a single DRIE step, the surrounding blind opening having a width which is greater than the width of the cavity.

This particular embodiment is particularly advantageous as a single step is used to form structures having different depths: the surrounding bling opening is deeper than the cavity as the grinding will open this opening before reaching the cavity.

The width of the surrounding blind opening can be the distance between the two opposite walls of the opening, and the width of the cavity can be its diameter, for example.

DRIE has been observed to provide faster etching speeds for wider openings. Hence, in a single step, the surrounding blind opening will be formed deeper than the cavity.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

We will now describe an electrical device comprising, on a semiconductor substrate, a capacitor and a surrounded substrate region which is electrically insulated from the rest of the substrate.

Figure 1:
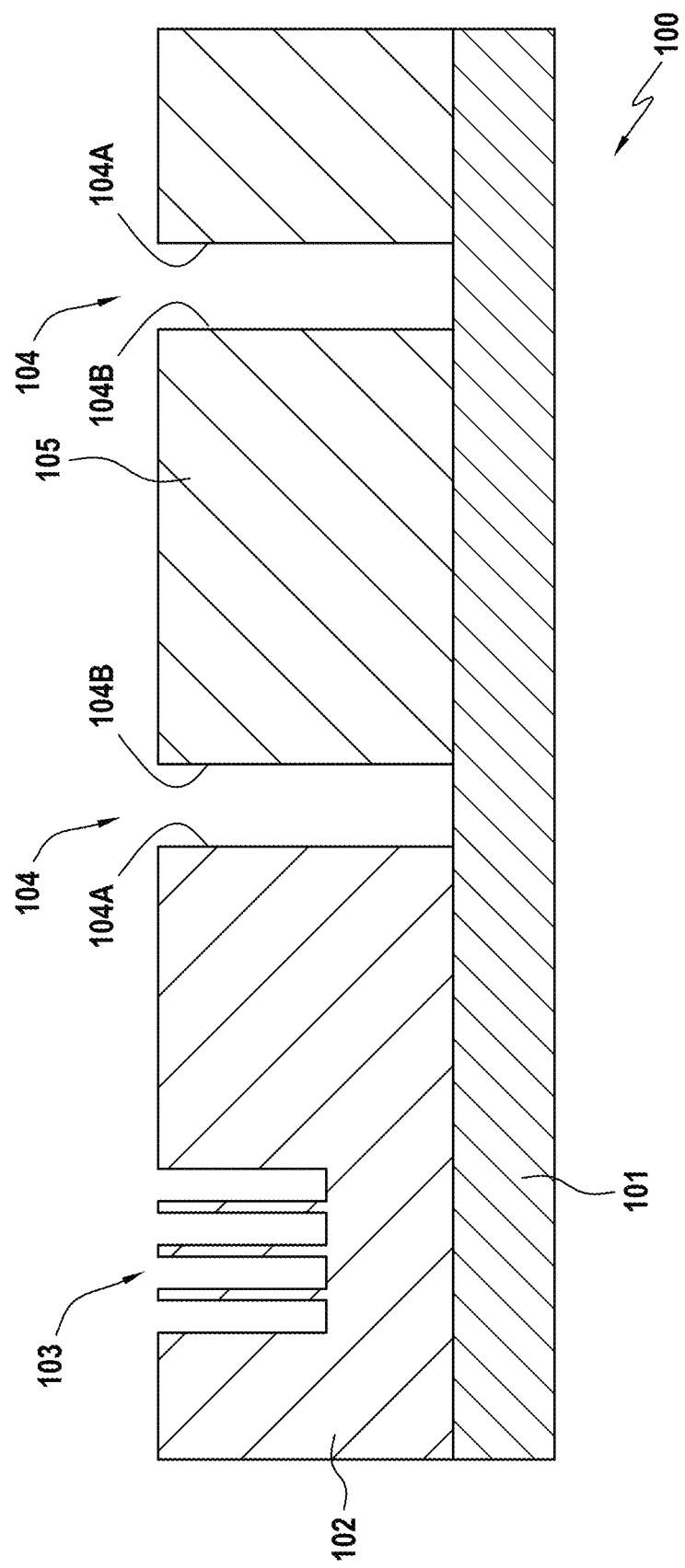
FIG. 1, is a cross-section of a base structure in which a capacitor and a surrounded region will be formed.

On FIG. 1, a substrate 100 is represented. The substrate 100 is a semiconductor substrate comprising, for example, silicon.

Preferably, the substrate 100 has a good conductivity, for example, it has an N++ doping level in its entirety.

Alternatively, and as shown on the figure, the substrate 100 can comprise a first portion 101 presenting an N++ doping level and a second portion 102 presenting a P– doping level of the substrate for example having a resistivity of 1 mOhm to 1 Ohm.

In order to form a 3D capacitor, a plurality of cavities 103 have been formed, for example using one of the methods described in document WO 2007125510 and using deep reactive ion etching (DRIE) to form vertical straight cavities.

A surrounding blind opening 104 is also formed using deep reactive ion etching. The height of this surrounding blind opening is greater than the length of the cavities 103. The surrounding blind hole 104 consists in a trench which surrounds a surrounded region 105. The surrounding blind hole therefore has an outer wall 104A and an inner wall 104B which is on the side of the surrounded region (it is also a wall of the surrounded region).

It should be noted that forming the surrounding blind opening 104 and the cavities 103 can preferably be done in a single etching step. For example, if DRIE is used, using masks with openings for the cavities 103 having a width which is smaller than the width of the openings for the surrounding blind opening 104 will lead to a faster etching reaction for the surrounding blind opening 104. Consequently, a single DRIE step can lead to cavities having different depths.

Figure 2:
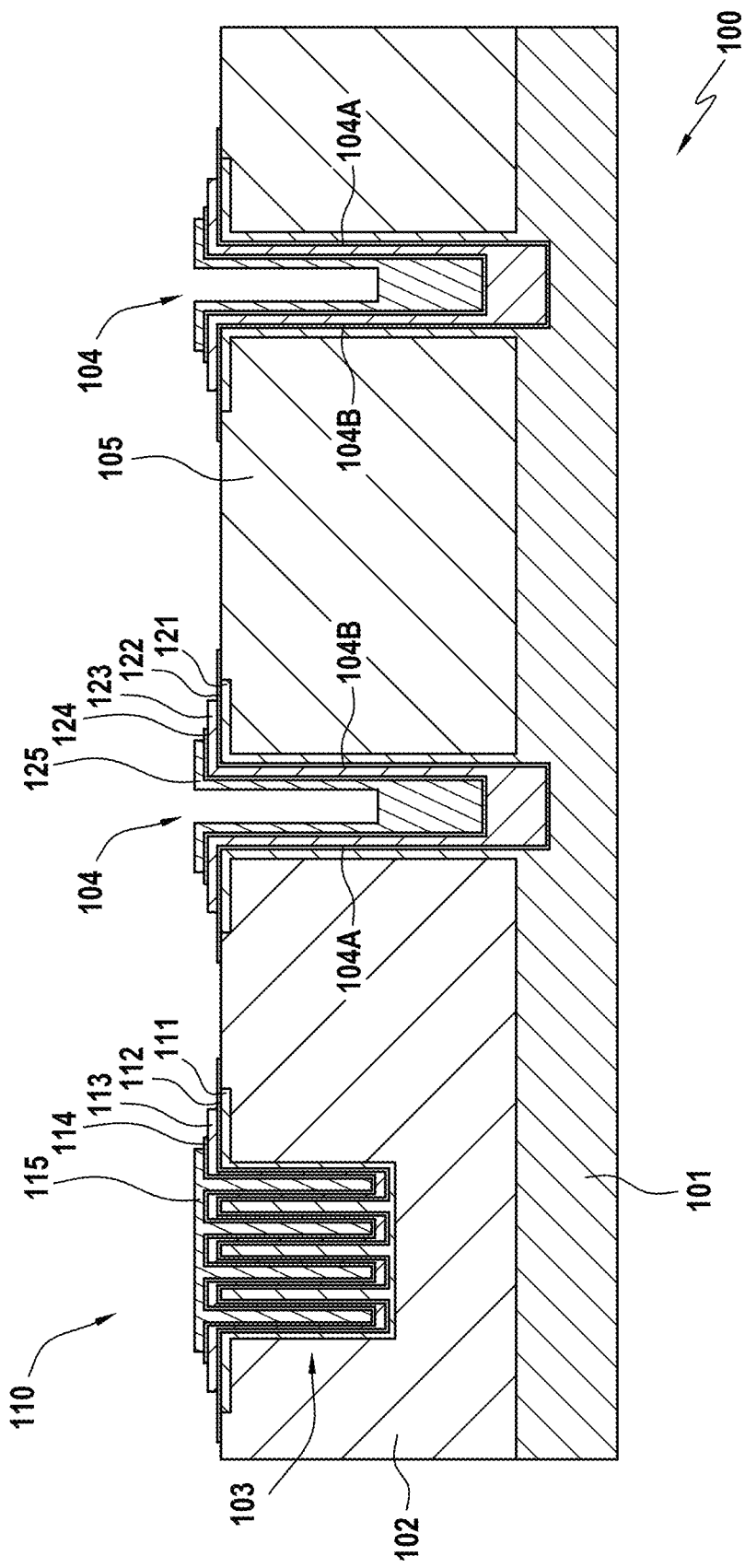
FIG. 2 is a device prior to a grinding step.

Subsequently and as shown on FIG. 2, the substrate 100 is locally doped where the cavities 103 and the surrounding blind hole 104 has been formed. Thus, a portion 111 of the substrate extending from the bottom and the side walls of the cavities becomes electrically conducting (the bottom electrode of a capacitor is formed), and a portion 121 of the substrate extending from the side walls of the surrounding blind hole becomes electrically conductive. This doping may be performed in a single step, using a patterned mask.

A dielectric layer may then be deposited in a conformal manner on the substrate, in the side walls and on the bottom of the cavities 103, and on the side walls and on the bottom of the surrounding blind hole 104. This dielectric layer can comprise silicon dioxide or a stack of silicon dioxide/nitride/silicon dioxide (ONO). This layer is patterned so as to form a capacitor dielectric region 112 around the cavities 103, and a surrounding dielectric region 122 around the surrounding blind hole 104.

A conductive layer is then deposited, for example comprising doped polysilicon, also in a conformal manner. This layer is subsequently patterned to obtain a capacitor electrode 113 (arranged on the side of the inside of each cavity with respect to the capacitor dielectric region 112), and a surrounding conductive region 123 (arranged on the side of the inside of the surrounding blind opening with respect to the surrounding dielectric region 122).

While a capacitor is formed at this stage, in the illustrated example, a MIMIM (Metal Insulator Metal Insulator Metal, which in the present application is used under a broad interpretation as covering doped polysilicon as metal) capacitor is formed. Consequently, a supplementary dielectric layer is deposited, again in a conformal manner, and this layer can comprise the same material as the previously deposited dielectric layer. This layer is patterned so as to form a supplementary capacitor dielectric region 114 (arranged on the side of the inside of each cavity with respect to the capacitor electrode region 113), and a supplementary surrounding dielectric region 124 (arranged on the side of the inside of the surrounding blind opening with respect to the surrounding conductive region 123).

The final and upper electrode of the capacitor is then formed. A supplementary conductive layer is deposited, in a conformal manner, and this layer can also comprise doped polysilicon. This layer is subsequently patterned to obtain a supplementary capacitor electrode 115 (arranged on the side of the inside of each cavity with respect to the supplementary capacitor dielectric region 114), and a supplementary surrounding conductive region 125 (arranged on the side of the inside of the surrounding blind opening with respect to the supplementary surrounding dielectric region 124).

It should be noted that at this stage, a capacitor 110 having a MIMIM structure is formed. The surrounded region 105 of the substrate is however not yet completely electrically insulated from the portion of the substrate in which the capacitor 110 has been formed.

Figure 3:
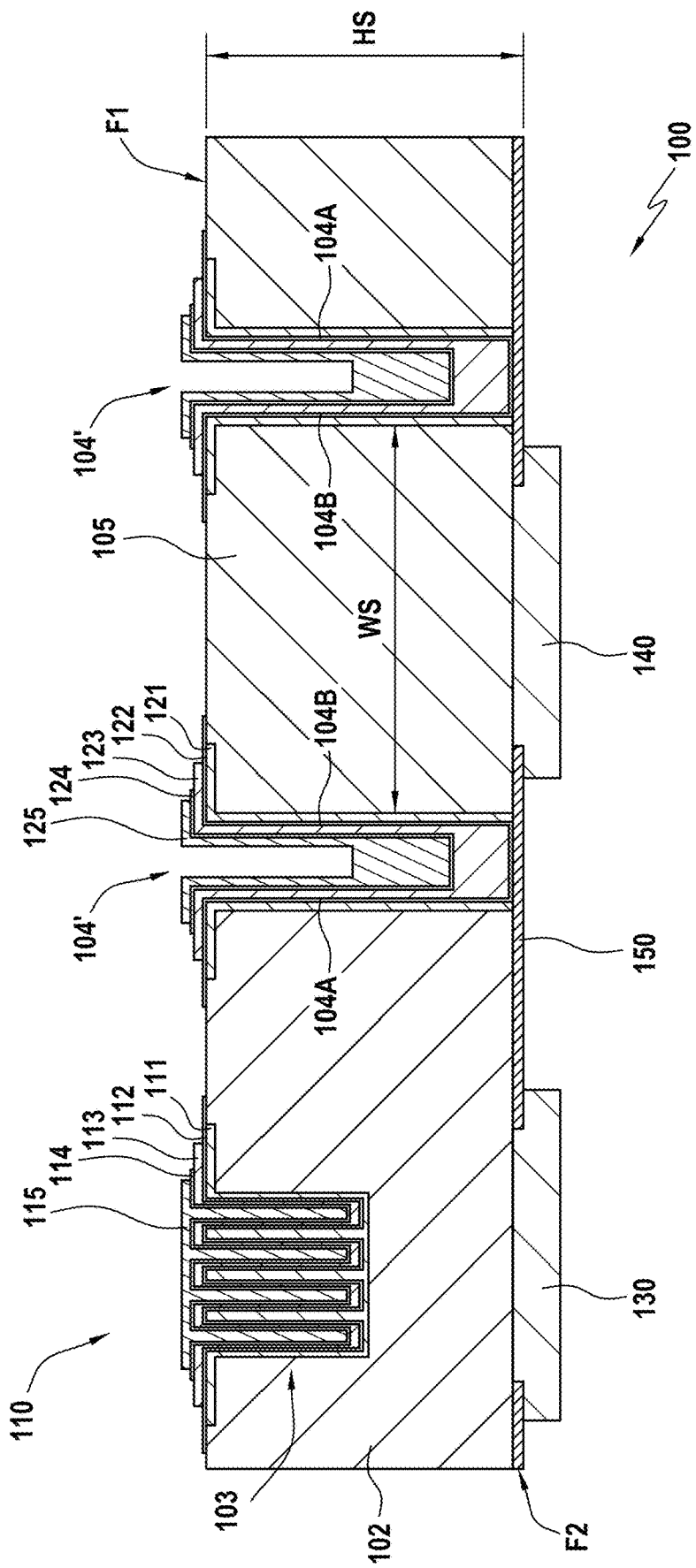
FIG. 3 is a device according to another example.

A grinding step can be performed, as shown on FIG. 3, to obtain an electrical device according to an example.

In all the embodiments described herein, the grinding does not reach the bottom of the cavities in which the 3D capacitor 110 has been formed.

The substrate 100 presents a top face F1, and the face opposite the top face can be grinded so as to reach the final bottom face F2, the surrounding dielectric region 122, and so as to open the surrounding blind opening to obtain a surrounding through opening 104' formed in the substrate. There remains a distance between the bottom of cavities 103 and the face F2.

The surrounded region 105 is now electrically insulated and defines an electrical domain which is electrically separated from the one in which the capacitor 10 has been formed. The surrounding dielectric region 122 extends in the surrounded through opening 104' from the top face F1 to the bottom face F2, and all around the surrounded substrate region.

The surrounding dielectric region extends, in the illustrated example, at the bottom of the surrounding through opening in a same plane as the bottom face F2 of the substrate. Alternatively, the grinding may remove more matter and stop, for example, when the surrounding conductive region 123 has been reached (as will be shown hereinafter in reference to FIG. 4).

It should be noted that a sufficient amount of matter should be present in the surrounding through opening so as to maintain a sufficient structural integrity of the device.

The surrounded region 105 is a portion of semiconductor material (for example having a resistance of about 1 Ohm), having the following dimensions annotated on the figure:

Height HS: 80 to 100 micrometers;
Width WS: 80 to 100 micrometers.

Thus, the surrounded region 105 can be used as a through via to transmit signals from the top face F1 to the bottom face F2, and these signals will travel in a voltage domain which is insulated from the other portions of the substrate.

Additionally, the illustrated structure provides an access to the bottom face F2, which allows forming a metal pad 130 below the region of the substrate which includes the capacitor. The metal pad 130 is connected to the bottom electrode of the capacitor 110 through a PN junction because of the presence of the doped region 111.

A metal pad 140 has also been formed below the surrounded region 105 so as to connect the bottom face of this surrounded region.

The metal pads 130 and 140 can be formed after an insulation layer 150 has been formed on the bottom face of the substrate, with openings where the metal pads 130 and 140 are to be formed.

The metal pads 130 and 140 can comprise a biocompatible material such as gold, and can act as electrodes for stimulating biological tissue if the device is an implantable device, for example.

Figure 4:
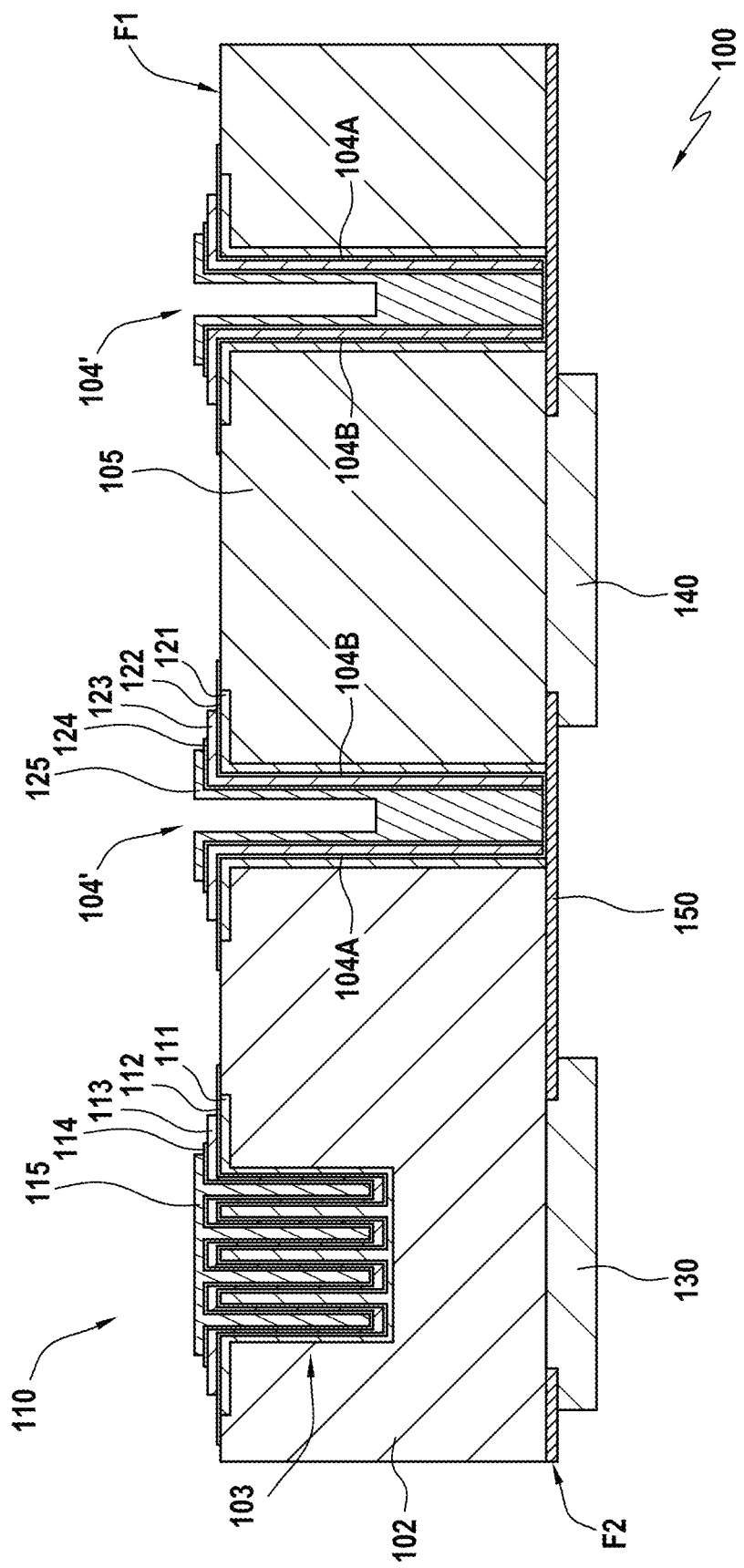
FIG. 4 is a device according to another example.

FIG. 4 is an illustration of an alternative device in which the grinding step is performed so that the supplementary surrounding dielectric region 124 is reached. In this configuration, four dielectric layers (two portions of the surrounding dielectric region 122 and two portions of the supplementary surrounding dielectric region 124) participate to the insulation of the surrounded region 105. Around each wall 104A and 104B, two capacitors arranged in series are thus formed.

Figure 5:
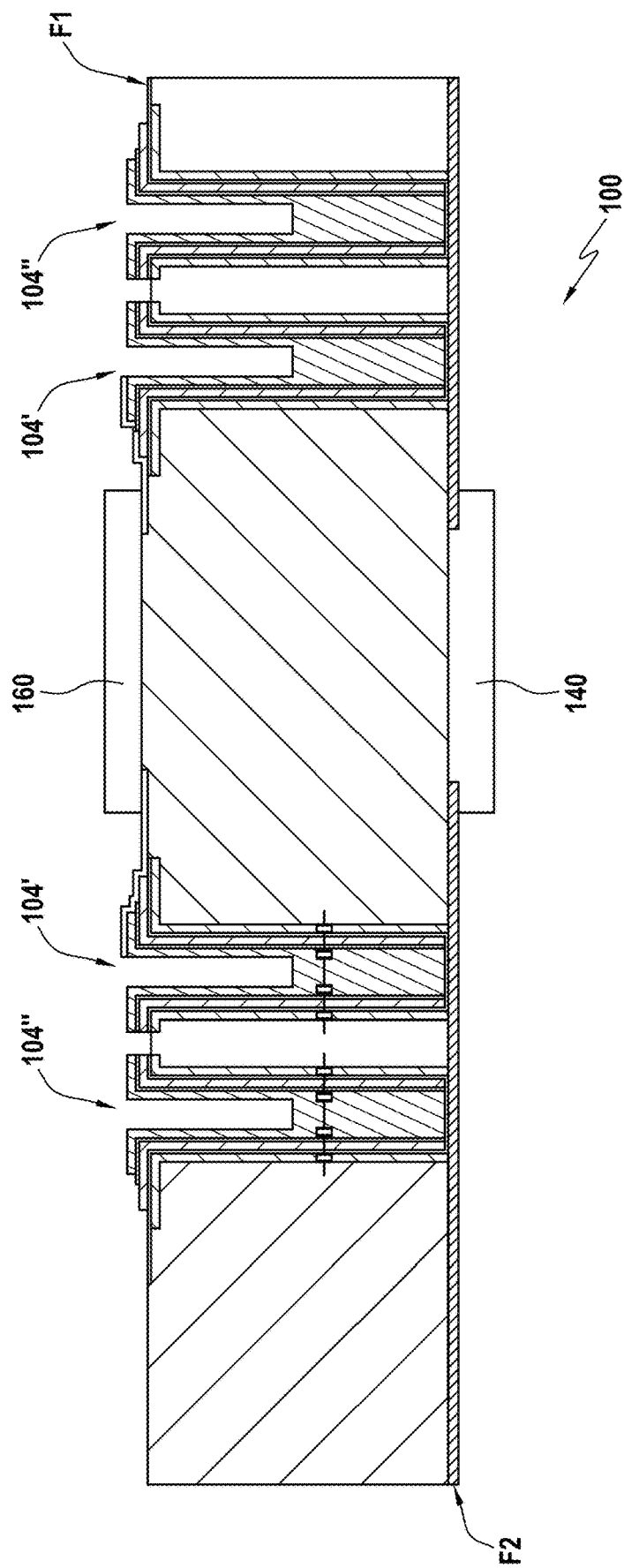
FIG. 5 is a device according to another example.

FIG. 5 shows an embodiment in which a supplementary surrounding through opening 104" surrounds the surrounding through opening 104'. This will increase the insulation and the breakdown voltage between the region 105 and the rest of the substrate. Indeed, 8 capacitors in series are shown to represent this insulation.

Additionally, on this figure, the surrounded region 105 has a metal pad 160 connected to its top face.

Figure 6:
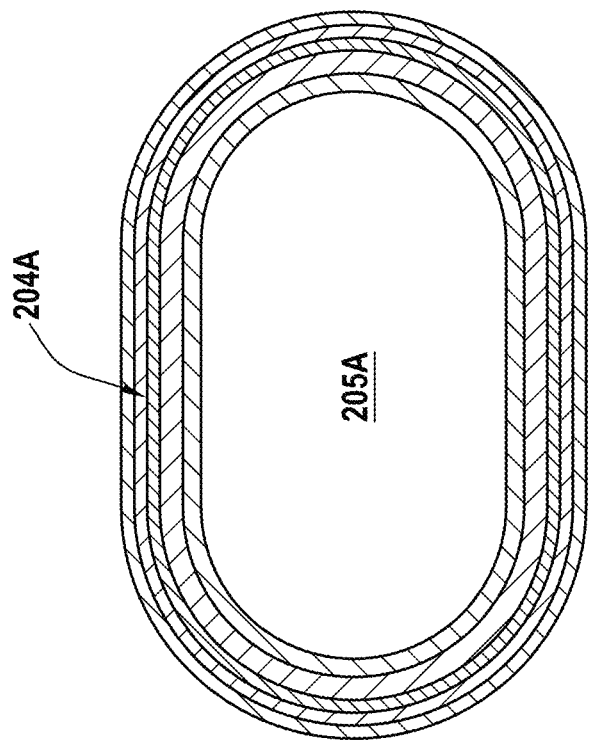
FIG. 6 is a top view of a device according to another example.
Figure 6:
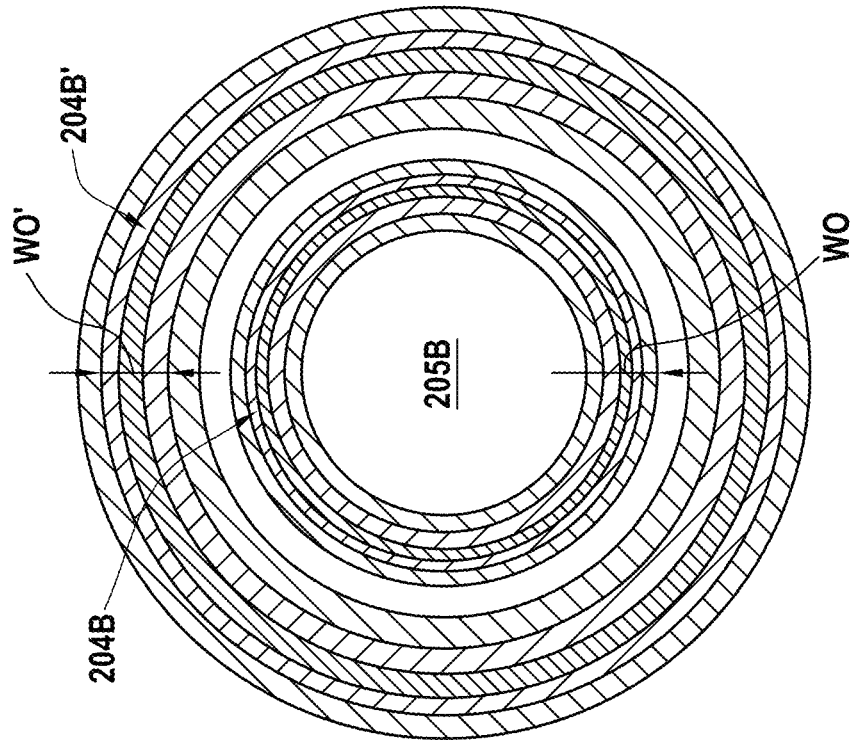

FIG. 6 is a top view of another exemplary device in which two surrounded regions 205A and 205B have been formed using the steps described in reference to FIGS. 1 to 5.

The surrounding region 205A is surrounded by a single surrounding through opening 204A partially filled with dielectric material and conductive material, as described hereinabove for example in reference to FIG. 4.

The surrounding region 205B is surrounded by a first surrounding through opening 204B and a second surrounding region 204B', both filled with dielectric material and conductive material, as described hereinabove for example in reference to FIG. 4.

The breakdown voltage between the region 205B and the rest of the substrate can not only be adjusted by adding additional surrounding through openings, but also by changing the thicknesses of the surrounding dielectric regions. As shown on the figure, surrounding through openings 204B and 204B' respectively have a width WO and a width WO' which differ.

Figure 7:
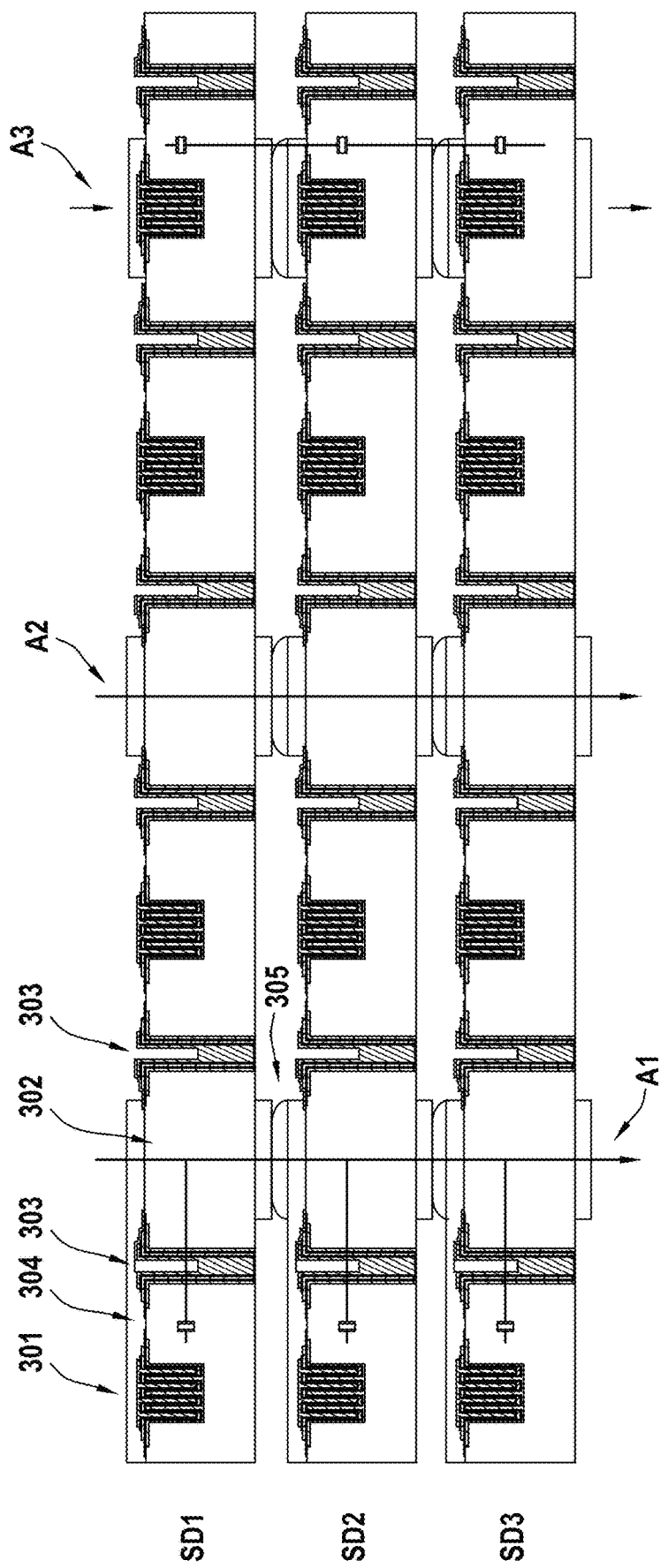
FIGS. 7, 8A, and 8B are exemplary applications of the examples.

On FIG. 7, a modular device has been shown in which sub-devices SD1, SD2, and SD3, having structures as described in relation to FIG. 3 or 4 are connected together.

Three electrical configurations are shown.

The first electrical configuration shown by the equivalent circuit A1 shows capacitors connected in parallel. More precisely, on each sub-device, 3D capacitors 301 have been formed and a surrounded region 302 has also been formed, surrounded by a surrounded through opening 303. On the top face of each device, a conductive region 304 is formed to contact the top electrode of the capacitors to the top of the surrounded region.

Furthermore, the surrounded regions 302 of each sub-device are aligned and connected together by a soldering pad 305.

The second electrical configuration is a vertical connection not connected to a capacitor, as shown by arrow A2. Surrounded regions are connected in series to form a vertical silicon via.

The third electrical configuration is a vertical arrangement of capacitors connected in series, as shown by arrow A3.

Figure 8A:
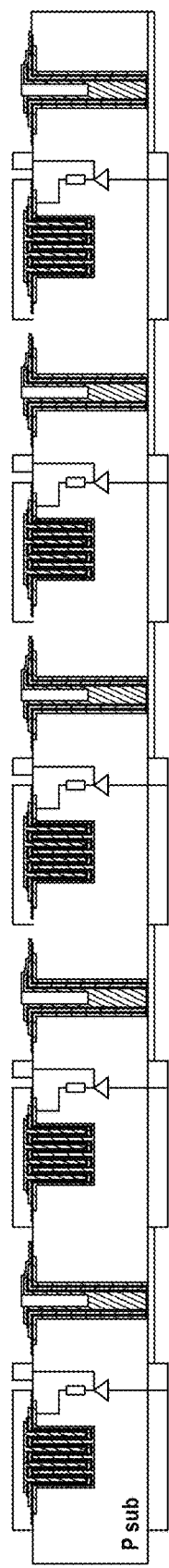
Figure 8B:
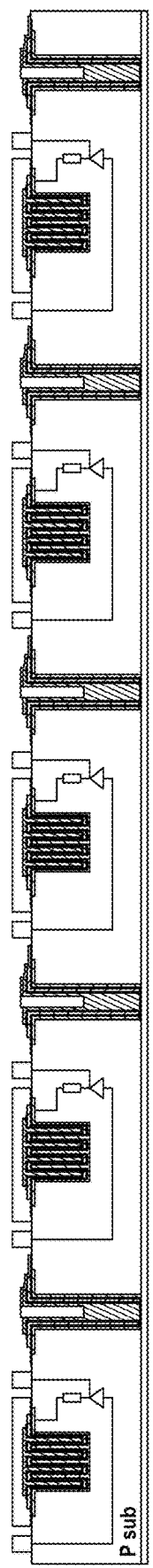

FIGS. 8A and 8B also show two different implementations of a low frequency voltage multiplier which use the diode formed in the substrate of each capacitor.

In the example of FIG. 8A, there is a bottom connection for each diode.

In the example of FIG. 8B, all the connections are implemented on the top.

In the examples of FIGS. 8A and 8B, there are capacitors in separate surrounded regions.

The above described devices and methods allow forming devices comprising 3D capacitors and fully insulated regions, using an already used process for manufacturing 3D capacitors.

The invention claimed is:

1. An electrical device comprising:
a semiconductor substrate having a top face and a bottom face;
a 3D capacitor including a capacitor dielectric region of a dielectric material, a capacitor electrode region of a conductive material, the capacitor dielectric region and the capacitor electrode region being arranged at least partially inside a cavity extending in the substrate from the top face; and
a surrounding through opening formed in the substrate and which surrounds a surrounded substrate region, the 3D capacitor being outside of the surrounded substrate region, the surrounding through opening extending from the top face to the bottom face of the substrate,
wherein inside the surrounding through opening a surrounding dielectric region of the dielectric material and a surrounding conductive region of the conductive material are arranged, the surrounding dielectric region extending in the surrounding through opening from the top face to the bottom face of the substrate and all around the surrounded substrate region.

2. The electrical device of claim 1, wherein the semiconductor substrate is electrically conducting at least in a portion of the substrate extending from the side walls and the bottom of the cavity, and in a portion of the substrate extending from the side walls of the surrounding through opening.

3. The electrical device of claim 1, wherein the capacitor dielectric region is arranged on the bottom and on the side walls of the cavity, and the capacitor electrode region is arranged on the capacitor dielectric region on the side of the inside of the cavity with respect to the capacitor dielectric region,
and wherein the surrounding dielectric region is arranged on the side walls of the surrounding through opening, the surrounding conductive region is arranged on the surrounding dielectric region on the side of the inside of the surrounding through opening with respect to the surrounding dielectric region.

4. The electrical device of claim 3, wherein the 3D capacitor comprises a supplementary capacitor dielectric region arranged on the capacitor electrode region on the side of the inside of the cavity with respect to the capacitor electrode region, and a supplementary capacitor electrode region on the side of the inside of the cavity with respect to the supplementary capacitor dielectric region,
and wherein inside the surrounding through opening a supplementary surrounding dielectric region is arranged on the surrounding conductive region on the side of the inside of the surrounding through opening with respect to the surrounding conductive region, and a supplementary surrounding conductive region is arranged on the supplementary surrounding dielectric region on the side of the inside of the surrounding through opening with respect to the supplementary surrounding dielectric region.

5. The electrical device of claim 4, wherein the supplementary surrounding conductive region or the supplementary surrounding dielectric region extends at the bottom of the surrounding through opening in the same plane as the bottom face of the substrate.

6. The electrical device of claim 1, wherein the surrounding dielectric region or the surrounding conductive region extends at the bottom of the surrounding through opening in the same plane as the bottom face of the substrate.

7. The electrical device of claim 1, wherein the surface area of the top of the surrounded region and of the bottom of the surrounded region is greater than 2000 um$^2$.

8. The electrical device of claim 1, further comprising a supplementary surrounding through opening surrounding the surrounding through opening, with the 3D capacitor being outside of the supplementary surrounding through opening,
wherein inside the surrounding through opening a surrounding dielectric region of the dielectric material and a surrounding conductive region of the conductive material are arranged, the surrounding dielectric region extending in the supplementary surrounding through opening from the top face to the bottom face of the substrate and all around the surrounded substrate region.

9. The electrical device of claim 1, further comprising a metal pad connected to the top of the surrounded region and/or a metal pad connected to the bottom of the surrounded region.

10. The electrical device of claim 1, further comprising a metal pad connected to the bottom face of the substrate below the 3D capacitor.

11. The electrical device of claim 10, further comprising a module connected to a metal pad connected to the top of the surrounded region or connected to a metal pad connected to the bottom of the surrounded region.

* * * * *